US006087875A

United States Patent [19]
Defazio

[11] Patent Number: 6,087,875
[45] Date of Patent: Jul. 11, 2000

[54] SINGLE-EDGE ADJUSTABLE DELAY CIRCUIT

[75] Inventor: Jody Defazio, Kanata, Canada

[73] Assignee: Mosaid Technologies Incorporated, Kanata, Canada

[21] Appl. No.: 09/031,732

[22] Filed: Feb. 27, 1998

[30] Foreign Application Priority Data

Jan. 20, 1998 [CA] Canada .................................. 2228243

[51] Int. Cl.[7] ...................................................... H03K 5/13
[52] U.S. Cl. ............................................ 327/276; 327/278
[58] Field of Search ..................................... 327/263, 264, 327/276, 277, 278, 281, 285, 288

[56] References Cited

U.S. PATENT DOCUMENTS

| | | | |
|---|---|---|---|
| 5,418,385 | 5/1995 | Kawamoto ................................ | 257/208 |
| 5,428,310 | 6/1995 | Casper et al. ............................ | 327/262 |
| 5,506,534 | 4/1996 | Guo et al. ................................. | 327/276 |
| 5,594,377 | 1/1997 | Choi et al. ................................ | 327/278 |
| 5,870,346 | 2/1999 | Komarck et al. ........................ | 365/226 |

*Primary Examiner*—Tuan T. Lam
*Attorney, Agent, or Firm*—Kevin Pillay; John R. S. Orange; Santosh K. Chari

[57] ABSTRACT

In accordance with this invention there is provided a circuit for delaying a selected edge of an input signal for use in a deep sub-micron process semiconductor device, the circuit comprising an inverter element having an input and output node, a load element comprising resistive and capacitive (RC) elements a first transistor element, coupled to the RC load element and selectively operable to couple the RC element to the output node upon receipt of the selected edge of the input signal and for decoupling the RC element from the output node upon receipt of an opposite edge of the input signal, whereby a delay is introduced by the load element on the selected edge of the input signal with little negative effect on the opposite edge of the input signal.

7 Claims, 2 Drawing Sheets

Simulated IN to OUT fall delays at programmed taps (nS)

| TAP0 connected to | TAP0 | TAP1 | TAP2 | TAP3 | TAP4 | TAP5 | TAP6 | TAP7 | TAP8 | TAP9 |
|---|---|---|---|---|---|---|---|---|---|---|
| SLOW | 14.35 | 13.66 | 12.98 | 12.34 | 11.74 | 11.21 | 10.76 | 10.40 | 10.13 | 9.95 |
| NOM | 12.12 | 11.34 | 10.54 | 9.78 | 9.01 | 8.28 | 7.62 | 7.08 | 6.68 | 6.44 |
| FAST | 11.44 | 10.66 | 9.86 | 9.09 | 8.32 | 7.96 | 6.86 | 6.28 | 5.82 | 5.56 |

{# SINGLE-EDGE ADJUSTABLE DELAY CIRCUIT

The present invention relates to electronic circuits, more specifically the circuits used to delay high speed digital signals.

BACKGROUND OF THE INVENTION

Semiconductor chips fabricated with sub-micron features, result in performance improvements, due to reduced parasitic capacitance and resistance, when compared to counterparts created with larger dimensions. Deep sub-micron is referred to as dimensions of less than 0.35 $\mu$M in width and a deep sub-micron MOSFET device is referred to a MOSFET device with a sub-micron channel length of less than 0.35 $\mu$M. However, even with the use of very narrow channel length for deep sub-micron MOSFET devices, specific regions of the deep sub-micron MOSFET still exist in which additional undesired parasitic capacitances adversely influences performance.

The circuits in a semiconductor device generally require the use of many timing, clocking and other digital pulse signals. Often, the signals needed are generated from a basic pulse by adjusting or processing the basic signal. The derived signals often need their rising edges only slightly delayed from the pulse in the basic signal from which it is obtained. At the same time however the derived signal requires its falling edge to be coincident with that of the corresponding edge of the basic signal. Thus it is necessary to delay only one edge of the derived signal.

Various circuits have been implemented in the art for trimming digital pulse signals. For example in U.S. Pat. No. 4,823,024, there is shown a MOS circuit for trimming a digital signal by delaying the rising edge of the pulse signal for a predetermined period of time and passing the falling edge without delay. The circuit utilizes a MOS signal buffer at its input for receiving and delaying the pulse signal and a MOS output transistor at the output of the circuit for providing the trimmed signal.

Other devices utilize a CMOS inverter circuit configuration with RC delay elements connected between the output of an NMOS device and the output terminal of the delay circuit. The RC circuit is utilized to slow the output from discharging during the input signal rising edges. One disadvantage of this circuit is that the RC elements are permanently connected to the output thus causing a negative effect on the falling edge of the input signal. Thus a PMOS device would have to charge the RC elements as it was attempting to swing the voltage on the input of the node. A second problem with this circuit is that it is difficult to adjust the length of the delay as required.

Circuits have been implemented with simple inverter based delay chains having modified channel widths and lengths. However as discussed earlier, due to the extreme low propagation delays of gates in deep sub-micron processors, a circuit for implementing a reasonable amount of delay would require a large number of gates and thus consume unacceptable amounts of semiconductor area. A further disadvantage of this circuit is that there is a large deviation in delay times over varying operating conditions and process variations. A still further disadvantage of this circuit is the difficulty in avoiding adverse effects on the falling edge of the input signal.

Thus there is a need for a circuit which may be utilized in a deep sub-micron process and which can apply a moderate delay to an input signal rising edge while minimizing the effect on the falling edge of the input signal. Furthermore there is a need to provide a circuit for which the delay may be adjusted and which utilizes a minimum semiconductor area while providing a relative degree of stability over varying operating conditions.

SUMMARY OF THE INVENTION

In accordance with this invention there is provided a circuit for delaying a selected edge of an input signal for use in a deep sub-micron process semiconductor device, the circuit comprising:

(a) an first inverter element having an input and output node;

(b) a load element comprising resistive and capacitive (RC) elements;

(c) a first transistor element, coupled to said RC load element and selectively operable to couple said RC element to said output node upon receipt of said selected edge of said input signal and for decoupling said RC element from said output node upon receipt of an opposite edge of said input signal, whereby a delay is introduced by the load element on the selected edge of the input signal with little negative effect on the other edge of the input signal.

In accordance with a further aspect of this invention, there is provided a second transistor element coupled to said RC element and selectively operable to precharge said capacitance element.

A further aspect of the invention provides for a second inverter element coupled to the output node.

A still further aspect of this invention provides for a chain of series coupled resistive elements coupled to one end of said capacitive element, said resistive elements may be selectively short circuited to vary said resistive load connected to said capacitive element, to thereby vary said delay.

BRIEF DESCRIPTION OF THE DRAWINGS

These and other features of the present invention will become apparent from the following description and the attached drawings in which.

DETAILED DESCRIPTION OF PREFERRED EMBODIMENTS

Figure 1:
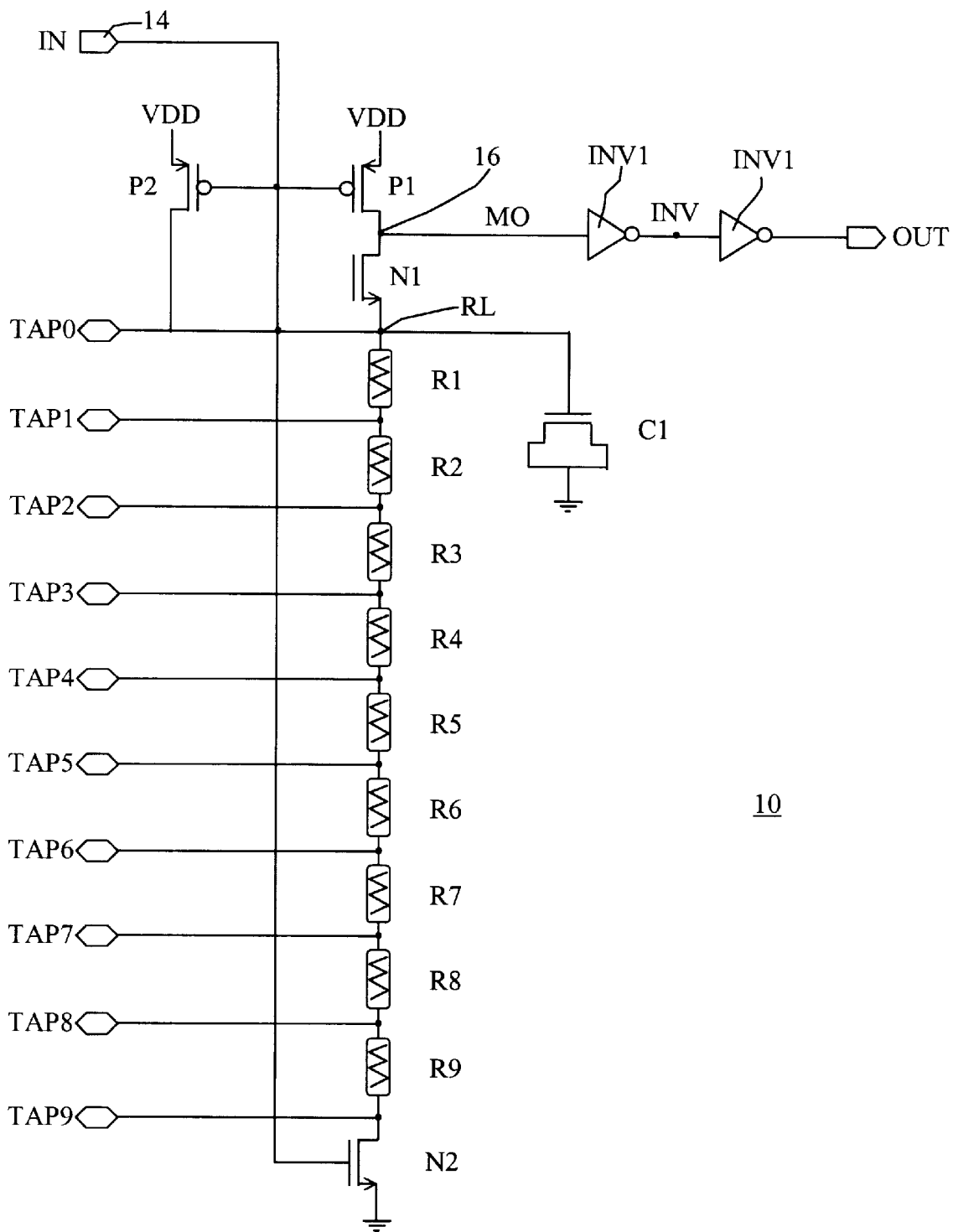
FIG. 1 is a circuit diagram of a single-edge adjustable RC delay circuit in accordance with the present invention.

Referring to FIG. 1, a single-edge adjustable RC resistor capacitor delay circuit is shown generally by numeral 10. The circuit 10 consists of a basic CMOS inverter circuit having an input node IN 14 and an output node M0 16. The inverter is comprised of a PMOS transistor P1 having its source drain circuit connected between a positive voltage supply $V_{DD}$ and the output node M0 and its gate terminal connected to the input node IN. A first transistor switch element formed by an NMOS transistor N1 having its source drain circuit connected between the output node M0 and a terminal of a series connected resistive chain of resistives R1 to R9 which is coupled to ground via the source drain circuit of the other of the inverter circuit transistor, which is an NMOS transistor having its gate coupled to the input terminal IN. A capacitive element formed by a MOS capacitor C1 is connected between ground and the resistive ladder node RL. A precharged transistor formed by a PMOS transistor P2 has its source drain circuit connected between $V_{DD}$ supply and the node RL and its gate terminal connected to the input node IN. An element for switching at a predetermined input threshold voltage, such as an inverter is} connected from the upward node M0 to the input of a second inverter INV2 to the output terminal of the delay circuit. The purpose of the second inverter is to provide a buffer on the output to drive large loads.

Figures 2, 3:
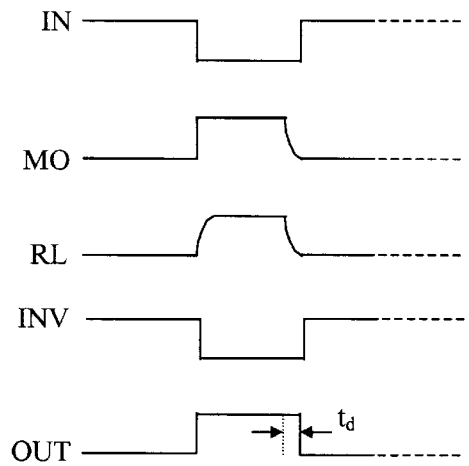
FIG. 2 is a wave form diagram of signals appearing in the circuit of FIG. 1, during operation thereof.
FIG. 3 is a table showing typical delay times versus resistor tap positions for the circuit of FIG. 1.

Referring to FIG. 2 the operation of the circuit may be more clearly described. On the falling edge of a signal applied to the input terminal IN of the circuit, i.e. when IN swings from high to low the PMOS transistors P1 and P2 turn on, while the NMOS transistors N1 and N2 turn off. By turning off both NMOS transistors N1 and N2, the RC load is isolated from node M0, thus allowing the PMOS transistor P1 to pull node M0 high quickly.

A further advantage of the transistors N2 turning off, allows the RC load to be isolated from the $V_{SS}$ supply as well so that P2 can turn on and precharge the RC load at node RL to supply voltage $V_{DD}$. This adds additional delay to the circuit as the capacitance C1 must be discharged before the output node M0 can swing low when the input signal goes high, thus providing additional delay. It may be noted that the capacitance contributing to the delay is not only determined by the MOS capacitor C1 but also by the wire segments interconnecting the various elements in the circuit as these are fairly long.

On the rising edge of an input signal, i.e. when IN swings from low to high the PMOS transistors P1 and P2 turn off while the NMOS transistors N1 and N2 turn on. The effect of this is that the output node M0 is released from the positive supply $V_{DD}$ due to P1 turning off. The capacitance of C1 plus the parasitic wire capacitance and the gate capacitance of the input to inverter INV1 must all be discharged to the threshold voltage of INV1 before the output of the inverter INV1 will switch. The output of this inverter INV1 is then passed to the circuit output via the input of inverter INV2 as described earlier.

It may be seen that the minimum delay time $t_d$ i.e. when all resistors are shorted out is set mainly by the size of capacitor C1 and the transistors N1 and N2. By making the NMOS devices N1 and N2 less resistive reduces the delay time while increasing the size of the capacitor C1 increases the delay time. The point at which the inverter INV1 switches is dependent on its threshold voltage. Thus the delay time is dependent on the time it takes the node M0 to reach the threshold voltage for the inverter INV1. It is preferable that the inverter INV1 device is larger than normal, in order to provide a more stable delay across process variations. As will be appreciated, the length and width of the wire used to create the R elements, R1 to R9, will determine the percentage of adjustability available and total layout area. These elements will change with process variation which must therefore be taken into consideration.

As described earlier, the taps, tap0 to tap9, allow for programmability of the series resistors R1 to R9. Specifically, by shorting two or more taps together the resistors connected in between these taps are shorted out. By connecting tap0 to tap9 will provide the shortest delay.

As may be appreciated, the current circuit design may also be utilized to create a delay for the input falling edge as opposed to the input rising edge. This may be simply achieved by reversing the logic such that the RC delay elements are switched in the series path between the PMOS transistor P1 and the output node $\mu$o to and utilizing a PMOS transistor as a switch. Furthermore if delay adjustability was not required the taps could be removed from the circuit. The characteristics of the delay curve could be modified by distributing MOS capacitors throughout the adjustable wire chain to allow major modifications to both R and C when tap positions were changed. Changing the MOS capacitor element from NMOS to PMOS would also effect the delay curve.

While the invention has been described in connection with the specific embodiment thereof and in specific uses, various modifications therefore occur to those skilled in the art without departing from the spirit as set forth in the appended claims. For example, the circuit of the current invention could be utilized during the design and development of any integrated circuit using an MOS or other like process. It may also be used where a one edge only delay is required or wherever a moderate delay time is required. The circuit is particularly useful for creating delays when there are area restrictions or when the delay must not have high variations due to temperature or process parameters. Furthermore this circuit design provides for full rail voltages on the input and output signals with a reasonable rise and fall times.

The terms and expressions which have been employed in this specification are used as terms of description and not of limitation, there is no intention in the use of such terms and expressions to exclude any equivalence of the features shown and described or portions thereof, but it is recognized that various modifications are possible within the scope of the claims to the invention.

The embodiments of the invention in which an exclusive property or privilege is claimed are defined as follows:

1. A circuit for delaying a selected edge of an input signal and for use in a deep sub-micron process semiconductor device, the circuit comprising:
    (a) a load element comprising resistive and capacitive (RC) elements;
    (b) a first transistor element, coupled to said load element and selectively operable to couple said load element to an output node upon receipt of said selected edge of said input signal and for decoupling said load element from said output node upon receipt of an opposite edge of said input signal; and
    (c) a second transistor element coupled to said load element and selectively operable to precharge said capacitive element while said load element is decoupled from said output node, whereby a delay is introduced by the load element on the selected edge of the input signal with little negative effect on the other edge of the input signal.

2. A circuit as defined in claim 1, said resistive and capacitive elements being connected in parallel.

3. A circuit as defined in claim 2, said load element including a plurality of series coupled resistive elements and associated taps for selectively short circuiting one or more of said resistive elements connected to said capacitive element.

4. A circuit as defined in claim 1, said selected edge being a rising edge of said input signal.

5. A circuit as defined in claim 1, said first transistor element being an NMOS transistor.

6. A circuit as defined in claim 1, including an inverter element coupled to said output node.

7. A method for delaying a selected edge of an input signal in a circuit for use in a deep sub-micron process semiconductor device, said method comprising the steps of:
    (a) coupling said input signal to an input node of a delay circuit;
    (b) selectively coupling a load element comprising resistive and capacitive elements of said delay circuit to an output node of said delay circuit upon receipt of said selected edge of selected input signal;
    (c) decoupling said load element from said output node upon receipt of an opposite edge of said input signal; and
    (d) precharging said capacitive element of said load element while said load element is decoupled from said output node.

* * * * *